United States Patent
Chew et al.

(10) Patent No.: US 7,886,262 B2
(45) Date of Patent: Feb. 8, 2011

(54) SYSTEM AND METHOD OF MAXIMIZING INTEGRATED CIRCUIT MANUFACTURING YIELD WITH FABRICATION PROCESS SIMULATION DRIVEN LAYOUT OPTIMIZATION

(76) Inventors: Marko P. Chew, 3270 S. Court, Palo Alto, CA (US) 94306; Yue Yang, 8153 Park Villa Cir., Cupertino, CA (US) 95014

(*) Notice: Subject to any disclaimer, the term of this patent is extended or adjusted under 35 U.S.C. 154(b) by 854 days.

(21) Appl. No.: 11/888,597

(22) Filed: Aug. 1, 2007

(65) Prior Publication Data
US 2008/0046846 A1 Feb. 21, 2008

Related U.S. Application Data

(60) Provisional application No. 60/838,023, filed on Aug. 15, 2006.

(51) Int. Cl.
*G06F 17/50* (2006.01)

(52) U.S. Cl. .................................. 716/132; 716/135
(58) Field of Classification Search ................ 716/1, 716/2, 18, 132–135
See application file for complete search history.

(56) References Cited

U.S. PATENT DOCUMENTS 6,587,992 B2 * 7/2003 Marple .......................... 716/2

* cited by examiner

*Primary Examiner*—Jack Chiang
*Assistant Examiner*—Binh C Tat

(57) ABSTRACT

A system and a method of maximizing the manufacturing yield of integrated circuit ("IC") design using IC fabrication process simulation driven layout optimization is described. An IC design layout is automatically modified through formulation of a layout optimization problem utilizing the results of layout fabrication process compliance analysis tools. The modification of layout is performed adaptively and iteratively to make an IC layout less susceptible to yield issues while maintaining design rule correctness and minimal circuit performance impact.

14 Claims, 9 Drawing Sheets

SYSTEM AND METHOD OF MAXIMIZING INTEGRATED CIRCUIT MANUFACTURING YIELD WITH FABRICATION PROCESS SIMULATION DRIVEN LAYOUT OPTIMIZATION

CLAIM OF BENEFIT TO PROVISIONAL APPLICATION

This patent application claims the benefit of the earlier filed U.S. Provisional Patent Application entitled "System and method of maximizing integrated circuit manufacturing yield with fabrication process simulation driven layout optimization", having Ser. No. 60/838,023, and filed Aug. 15, 2006.

TECHNICAL FIELD OF APPLICATION

This invention relates generally to the design and manufacture of integrated circuitry and more particularly to a system and a method of maximizing manufacturing yield by using layout optimization driven by integrated circuit fabrication process simulation.

BACKGROUND OF THE INVENTION

The electronic circuit of an integrated circuit ("IC") consists of connected components such as transistors, diodes and resistors. The description of the components and their interconnections is called a netlist. Each component is mapped to one or more layout objects that are two-dimensional geometrical objects such as, but not limited to, rectangles, polygons, and paths. Two-dimensional objects also exist for the connections among the components. In turn, these layout objects are used to define regions within a semiconductor die, which will receive different processing steps such as, but are not limited to, dopant implants to produce N-type or P-type regions and thin oxidation regions for transistor gate areas. Typically, layout objects are assigned to specific layers associated with an IC fabrication step such as P-implant or poly deposition. The collection of two-dimensional objects for a given layer is called a layout mask and the collection of layout masks for all layers is called a layout mask data.

Every layout object must satisfy so called design rules that specify geometrical requirements for each object as well as the relationship of an object to other objects. Examples of such requirements include, but are not limited to, such items as minimum width and minimum spacing from one object to another object.

The IC fabrication process is such an extremely complex process so that the sequence of IC fabrication process steps indicated by an IC mask data might not produce the semiconductor structures with sufficient accuracy to assure correct circuit operation. If the circuit performance of a fabricated IC does not meet the required product specifications, then the IC must be discarded. If there are too many discard ICs, then the yield or fraction of good IC will be low and results in higher overall cost for the good ICs.

Any issue with the various steps in IC fabrication procedure could cause the resulting semiconductor structures to deviate sufficiently to cause the fabricated IC to be bad. Examples of important process steps include, but are not limited to lithography, random defect control, and chemical mechanical polishing ("CMP").

Fabrication process engineers are tasked with ensuring that the resulting fabricated semiconductor structures are accurate as possible as in order to maximize IC yield. Starting at the 130 nm process node and continuing to the current process nodes, the interaction of process and design has made this task much more difficult. This is because it is no longer possible to have a fabrication process recipe that produces the optimal yield for all possible mask layout data. Since it is very difficult to tune fabrication process recipe for each layout mask data, the trend is to adjust mask layout data to ensure the highest yield for a given fabrication process recipe.

IC fabrication process software simulators can model the various steps of an IC fabrication procedure. Traditionally, fabrication process engineers have used these process simulators to guide the development of new fabrication process recipes. Due to the negative effect of the interactions between mask layout and process on IC yield, the use of process simulation has expanded beyond process engineers to mask data preparation and design engineers ("design engineers"). These engineers use process simulations to guide mask layout data creation so that mask data is more compatible with a given process recipe. In effect, mask data is modified in order to increase the eventual fabricated IC yield.

Examples of process simulation software increasingly used by design engineers include, but are not limited to lithography simulation, CMP modeling, and defect sensitivity simulations. The results of these process simulations are used to identify layout configurations with potential yield limiting manufacturing issues and to adjust the mask layout correspondingly.

The next sequence of discussions describe several examples of how process simulations are used to modify the mask layout data. Those versed in the art will recognize that the descriptions are not exhaustive and could be easily extended to other scenarios where mask layout data is adjusted to avoid manufacturing issues using process simulation results.

Lithography

One process simulation increasingly being used by design engineers is lithography simulation. The lithography step is used to transfer mask patterns onto a semiconductor substrate. Any loss of fidelity on the transferred pattern from that of the mask may result in decreased in IC yield. The accuracy of the translation depends on factors including, but not limited to, the optical distortion that depends on layout feature sizes relative to lithography wavelength; the distortion introduced by resist development; the distortion introduced by resist etching process.

In modern day lithography, the shrinking of feature size has by far outpaced the shrinking of wavelength of light sources used in lithography. For current process nodes of 90 nm and below, the distortion introduced by lithography imaging is becoming a dominant factor in accuracy in the translation of design data to wafer images. Various technologies have been developed to solve this problem, including optical proximity correction ("OPC") and use of phase shift mask ("PSM"). OPC is performed on design data by adding/removing features to layout geometries, in order to compensate the distortion introduced by lithography imaging. PSM is performed by arranging out-of-phase of light waves at the alternative sides of critical dimension ("CD") features, in order to enhance image printing of these features. The various techniques to improve the printability is collectively called resolution enhancement technique ("RET") and includes, but is not limited to, OPC, PSM, and line width biasing.

There are two major categories of OPC: rule-based and model-based. Rule-based OPC is performed based on certain preset rules on how OPC features are constructed. It has the advantage of short run time. However, since it does not consider design context of layout geometries, its functionality and effectiveness is very much limited. Model-based or simulation-based OPC is performed based on lithography simulation of layout geometries and features, so it is much more accurate and effective. Prior development of several fast lithography simulators makes model-based OPC practical. One prior art performs OPC iteratively in order to ensure simulation consistent with changes of OPC features; another prior art performs so called aggressive OPC by directly performing inverse transform from desired target printed shapes.

The results and performance of model-based OPC depends on certain "recipes" used including, but not limited to, lithography simulation approach and edge fragmentation methodology. This makes it necessary to verify the results of OPC using so called "OPC verification" tools. OPC verification tools checks how accurately post-OPC layout data print on wafer during lithography process and whether disastrous problems such as, but not limited to, opens and shorts happen to images printed on wafers. OPC verification is performed at one process corner or across a process window. OPC verification tools may find OPC violations that happen due to reasons such as, but not limited to, design patterns beyond usage under which OPC recipes are developed; limitation of OPC recipes on various process corners; and certain design patterns are inherently difficult to be adjusted for OPC. While it is possible to fix OPC violations that are due to limited OPC recipes or incomplete design pattern coverage of OPC recipes through use of specifically design OPC recipes; there are certain OPC violations due to certain design patterns that cannot possibly be fixed by modifying OPC process recipes. OPC violations are normally called "hotspots"; the hotspots that cannot be fixed by adjusting OPC recipes are called "OPC hard hotspots" in design layout. "OPC hard hotspots" can only be fixed by adjusting pre-OPC design layout.

For IC manufacturing process nodes prior to 90 nm process node, the occurrences of OPC hard hotspots are rare. What are identified as "OPC hotspots" with rule-based OPC are likely fixable through use of model-based OPC. Since imaging distortion of layout geometries introduced by lithography does not greatly depend on surrounding geometries; design layout that passes design rule check ("DRC") are expected to be free of OPC hotspots by using correctly tuned OPC recipes, with very few or none exceptions.

For IC manufacturing process nodes starting from 90 nm process node, the image distortion of layout geometries introduced by lithography depends at a higher degree on its surrounding layout geometries. The implication of this fact is that, in order to generate layouts that have high manufacturing yield, IC fabrication foundries have to provide numerous context-dependent physical design rules that are much more complex than what have been used so far, especial for CD layers. Context-dependent physical design rules not only put a great amount of burden on mask layout designers and layout tools; they are also inherently incomplete. There is virtually no way to capture all possible design patterns with various contexts in a reasonable number of design rules, in the format that may be understood and suitable for use by mask layout designers and layout tools.

Chemical Mechanical Polishing

Another example of process simulation increasingly being used is chemical mechanical polishing (CMP) process simulation to predict such effects as interlayer dielectric ("ILD") variations. The ILD variations are important since these variations could cause a circuit's interconnection parasitic capacitances to vary significantly from design specifications and results in circuit performances not meeting the design specifications.

The minimum and maximum density design rules are one attempt to mitigate too wide a range of ILD variations. In this approach, dummy geometries called fill are inserted into empty regions in a mask layout in order to get the preferred range of pattern density values. One of the issues with this technique is that a mask layout with a pattern density value within the allowed range may still have ILD variations significant enough to cause circuit performance issues. This is because ILD variations are mostly localized phenomena involving layout geometry and its neighbors while pattern density is computed over a much larger layout region involving much more layout geometries.

CMP process simulators model the ILD variations for a mask layout. These ILD variations can then be fed back to the design phase to make adjustments to mitigate effects on circuit performance. Without the ILD feedback results, the IC circuit designer would be forced to assume overly conservative assumptions that could result in excessive layout area penalty and eventually higher product cost. Even with ILD variation feedback, IC circuit designers would have to accommodate the worst-case ILD variations reported by CMP simulators. A better solution would be to guide the mask layout generation to avoid widely divergent ILD variations.

Particle Defect Density Control

Particle defects are either missing or extra materials caused by particles during fabrication process that could cause such circuit issues as, but not limited to, opens and shorts in a fabricated IC. Defects are random phenomenon that is characterized by a defect density distribution. The lower the defect density distributions for a given fabrication process, the lower the probability of defects causing issues in the fabricated circuits.

Different mask layout data have different sensitivities to particle defects. These sensitivities are a function of such characteristics as, but not limited to, spacing between layout geometries and layout geometry widths. The larger the spacing between geometries, the less susceptible layout geometries are to defects causing electrical shorts. Likewise, the larger a geometry's width, the less susceptible the geometry to the occurrence of opens due to missing material defects.

There are several techniques to gauge the sensitivities of a mask layout to particle defects. One method is to utilize Monte Carlo sampling techniques to inject a sample population of defects into a mask layout and evaluate the occurrence of shorts and opens in the actual mask layout. Another method is to use a critical area analysis ("CAA") of the mask layout to generate statistics of susceptibility for particles of given size and type. The CAA results are then weighed by the defect density distribution to generate the defect sensitivity for the given mask layout. For any method, a mask layout with a lower defect susceptibility would have a higher probability of higher IC yield.

The standard method of decreasing the susceptibility of a mask layout to defects is increasing the spacing between geometries ("wire spreading") for extra particle defects and increasing layout geometry widths for missing particle defects. In either scenario, the mask layout must be modified to reduce the sensitivity for the specified defect density distribution.

SUMMARY OF THE INVENTION

The present invention provides a system and a method of maximizing IC manufacturing yield with IC fabrication process simulation driven layout optimization. An IC design layout is adaptively and iteratively modified in a layout optimization system consisting of a layout fabrication process compliance analysis ("LFPCA") composed of IC fabrication process simulators and layout process compliance analysis, along with a layout optimization step.

It is an object of the present invention to utilize the LFPCA information during the layout optimization step to reduce the design layout susceptibility to LFPCA identified issues so as to improve manufacturing yield.

It is a further object of the present invention to produce an optimized layout which is design rule correct as well as being layout versus schematic (LVS) correct with fewer fabrication process issues than the original layout.

It is another object of the present invention to allow an optimized layout to have the same design hierarchy as that of the starting layout. In a hierarchical layout, the potential exists for LFPCA issues to be resolved by adjusting instance locations rather than layout edges during the layout optimization step of the present invention.

It is a further object of the present invention to have a optimized layout with none or slight perturbation to design performance and other metrics including, but not limited to, area and timing from the starting layout.

These and other objects, features and advantages in accordance with the present invention are provided by a system and a method of maximizing manufacturing yield by using automatic layout optimization driven by LFPCA analysis.

DETAILED DESCRIPTION OF THE PREFERRED EMBODIMENTS

This invention relates to an integrated circuit mask layout optimization system and an integrated circuit mask layout optimization method, and more to a methodology for maximizing manufacturing yield by using automatic layout optimization driven by IC fabrication process simulation and layout fabrication process compliance analysis. The present invention describes a system and a method of representing layout using a set of variables; formulating metrics of fabrication process quality which is directly correlated to manufacturing yield through LFPCA; identifying a function of sensitivity of each variable representing design to the metrics of LFPCA quality and formulating an optimization problem to maximize manufacturing yield by changing the variables representing a design mask layout data within predefined ranges and within the constraints imposed by design rules and other requirements; iterating the procedure in order to converge to a final optimized result.

In the preferred embodiment, a method of formulation and a method of maximizing manufacturing yield by using layout optimization driven by IC fabrication process simulation and layout fabrication process compliance check is presented.

In the following description, numerous details are set forth for purpose of explanation. However, one of skill in the art will realize that the invention may be practiced with the variations of these specific details. In other instances, well-known structures or operations are not shown in detail to avoid obscuring the invention.

Computing Environment

Figure 1:
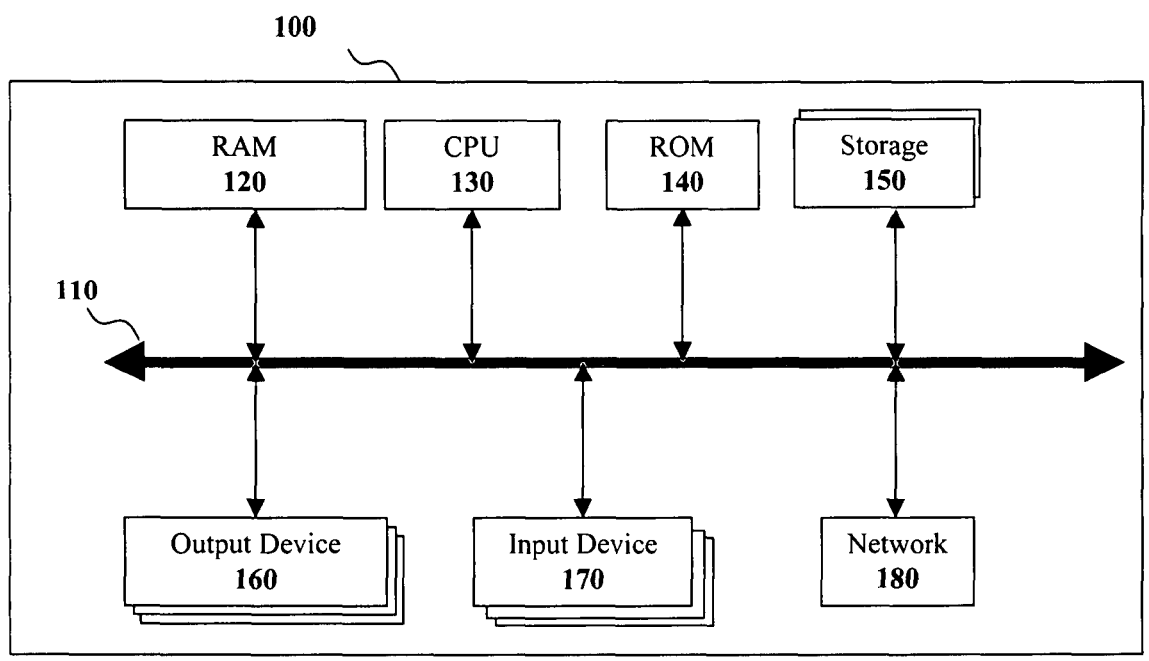
FIG. 1 illustrates a computing environment used in some embodiments of the present invention.

FIG. 1 illustrates a block diagram of the computing environment that one embodiment of the present invention is implemented. Even though the computer system is described with specific components and architecture for illustration, it should be understood that the present invention might be implemented in several other types of embodiments. For example, the invention can be implemented on single computer with a processor chip containing 2 or more processor cores with each core containing additional hardware to maintain state of two or more threads of execution. In addition, each component can be implemented as a combination of one or more of hardware, software and firmware, even though many features of the present invention are described herein as being implemented in software.

The computing environment 100 may contain one or more components such as a communication fabric 110, random access memory (RAM) 120, central processing unit (CPU) 130, read only memory 140 (ROM), secondary memory (Storage) 150, output devices 160, input Devices 170, network interface 180. All the components may communicate with each other over communication fabric 110. The communication fabric 110 collectively represents all systems, peripherals, chipset buses and all other communication pathways that can connect the components of the computing environment 100. The components of FIG. 1 are described below in further detail.

CPU 130 retrieves the instructions and data to process in order to execute the processes of this invention from the various storage components of computing environment 100. The ROM 140 stores the static instruction and data not modified during normal operation and are needed by CPU 130 and any other component of the computing environment 100. Read-write memory (RAM) 120 is a volatile storage that requires power to be supplied to store the instructions and data. Storage 150 is nonvolatile storage that doesn't need power to store instructions and data. In some embodiments, storage 150 use fixed mass-storage devices such as disk drives. Other embodiments use removal mass-storage devices such as removable disk drives. The RAM 120 stores some of the instructions and data that the CPU 130 needs. In some embodiments, the invention's processes are stored in the CPU 130, RAM 120, ROM 140, and/or storage 150.

The input device 170 enables the user to issue commands to the computing environment. Examples of an input device 170 include but are not limited to, keyboards, mouse, and/or tablet and stylus. The output device 160 is used to display images generate by the computing environment such as but not limited to optimized integrated circuit mask layout.

Network interface 180 may be implemented using protocols such as TCP/IP, ATM and/or Ethernet. In this manner, the computer can be a part of a network of computers (such as a local area network ("LAN"), a wide area network ("WAN"), or an Intranet) or a network of networks (such as the Internet). Any, some or all of the components of computing environment 100 may be used in conjunction with the invention. However, one of ordinary skill in the art would appreciate that any other system configuration may also be used in conjunction with the present invention.

As noted above, CPU 130 may retrieve the software instructions, and execute the instructions to provide various features of the present invention. The features of the present invention are described below in further details.

General Flow

The present invention provides a system and a method of maximizing IC manufacturing yield with IC fabrication process simulation driven layout optimization. An IC design layout is adaptively and iteratively modified in a layout optimization system consisting of a layout fabrication process compliance analysis ("LFPCA") composed of IC fabrication process simulators and layout process compliance analysis, along with a layout optimization step.

It is an object of the present invention to utilize the LFPCA information during the layout optimization step to reduce the design layout susceptibility to LFPCA identified issues so as to improve manufacturing yield.

It is a further object of the present invention to produce an optimized layout which is design rule correct as well as being layout versus schematic (LVS) correct with fewer fabrication process issues than the original layout.

It is another object of the present invention to allow an optimized layout to have the same design hierarchy as that of the starting layout. In a hierarchical layout, the potential exists for LFPCA issues to be resolved by adjusting instance locations rather than layout edges during the layout optimization step of the present invention.

It is a further object of the present invention to have a optimized layout with none or slight perturbation to design performance and other metrics including, but not limited to, area and timing from the starting layout.

Figure 2:
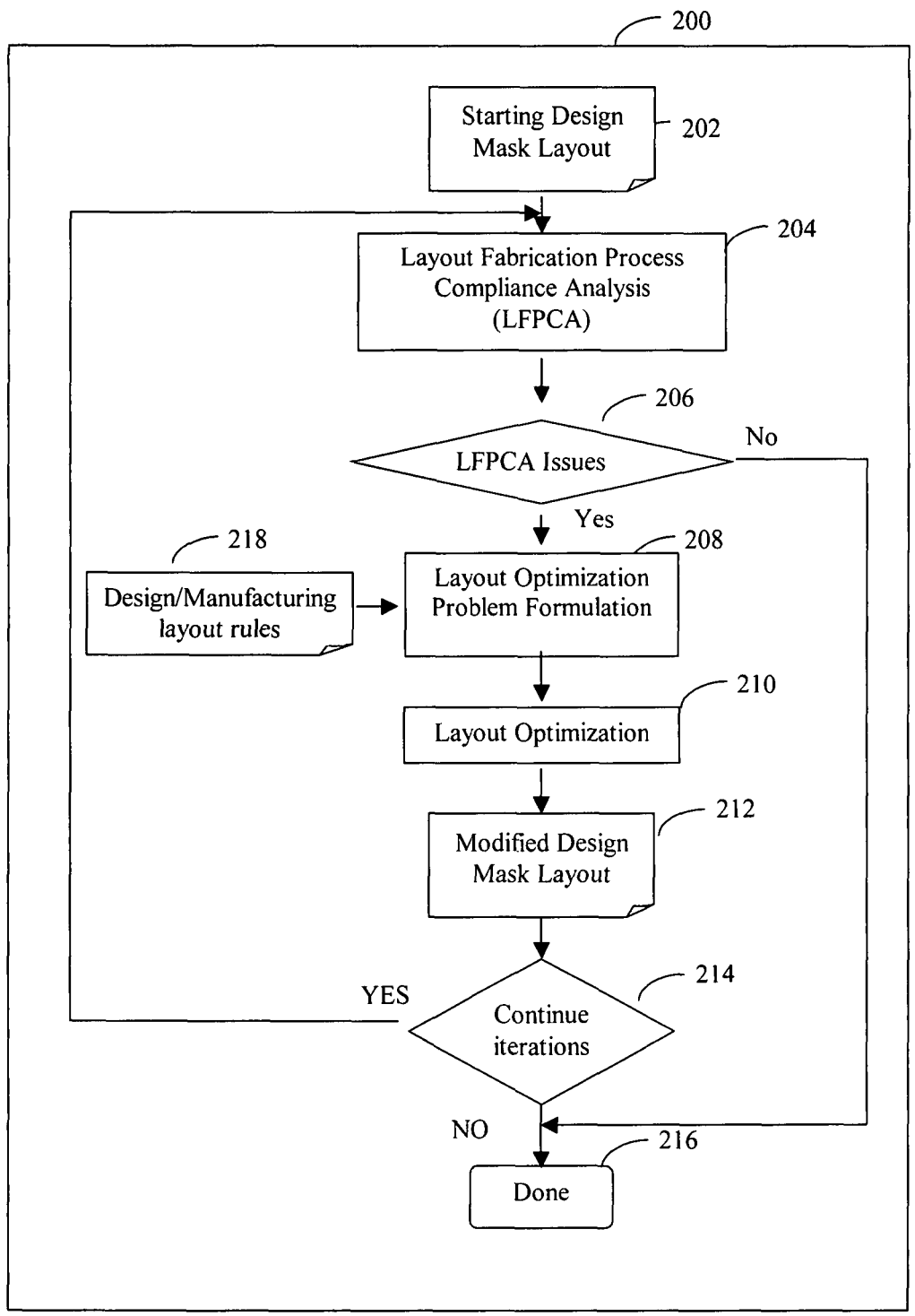
FIG. 2 illustrates a general flow 200 of fabrication driven layout optimization of the present invention.

FIG. 2 illustrates a general flow 200 of IC fabrication process simulation driven layout optimization described in the present invention. The starting layout 202 is analyzed at the layout fabrication process compliance analysis ("LFPCA") step 204. At 206, if there are no LFPCA issues, the process continues to 216 where the process terminates. If there are LPCA issues, the process continues to 208 where formulation of a layout optimization problem to resolve the LPCA issues are constructed using the results of LFPCA analysis as well as design and/or manufacturing layout rules ("design rules") 218. Layout rules include such rules, but are not limited to, the traditional rules included in design rule documents. The process continues to 210 where a layout optimization problem from 208 is solved to produce the optimized layout 212. At 214, the process determines if the maximum number of iterations or other limits have been reached and returns to 204 with the modified layout if not. If the maximum iterations or other limits have been reached, the process continues to 216 and terminates.

Figure 3:
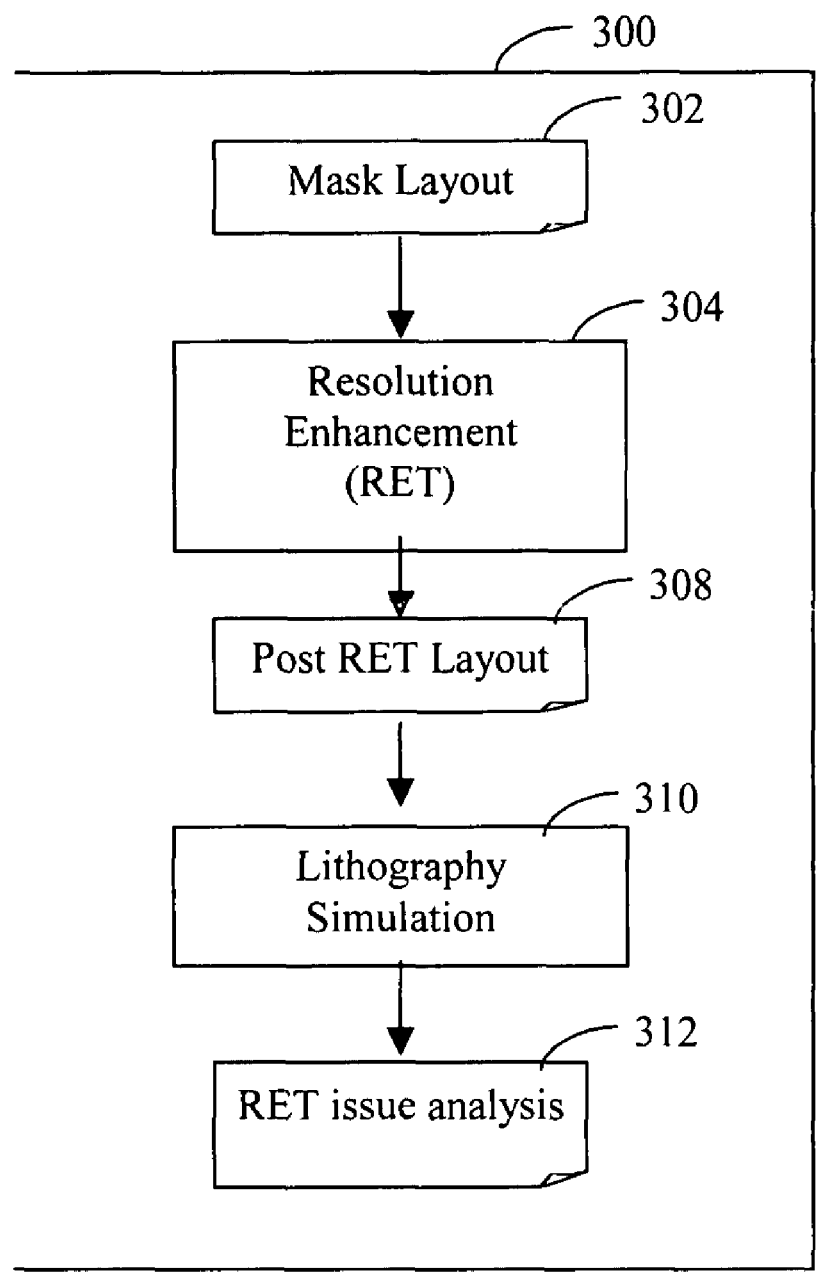
FIG. 3 illustrates an LFPCA flow in a lithography process simulation embodiment of the present invention.

FIG. 3 illustrates an embodiment of a lithography simulation based LFPCA process 300 for the present invention. At 304, the process performs resolution enhancement ("RET") procedure on the mask layout 302 to produce the post RET layout 308. The RET procedure include such operations such as, but not limited to, construction of OPC features and PSM phase assignments. The lithography simulation 310 accepts the post-RET layout 308 and its results are analyzed at 312 for any RET issues.

Figure 4:
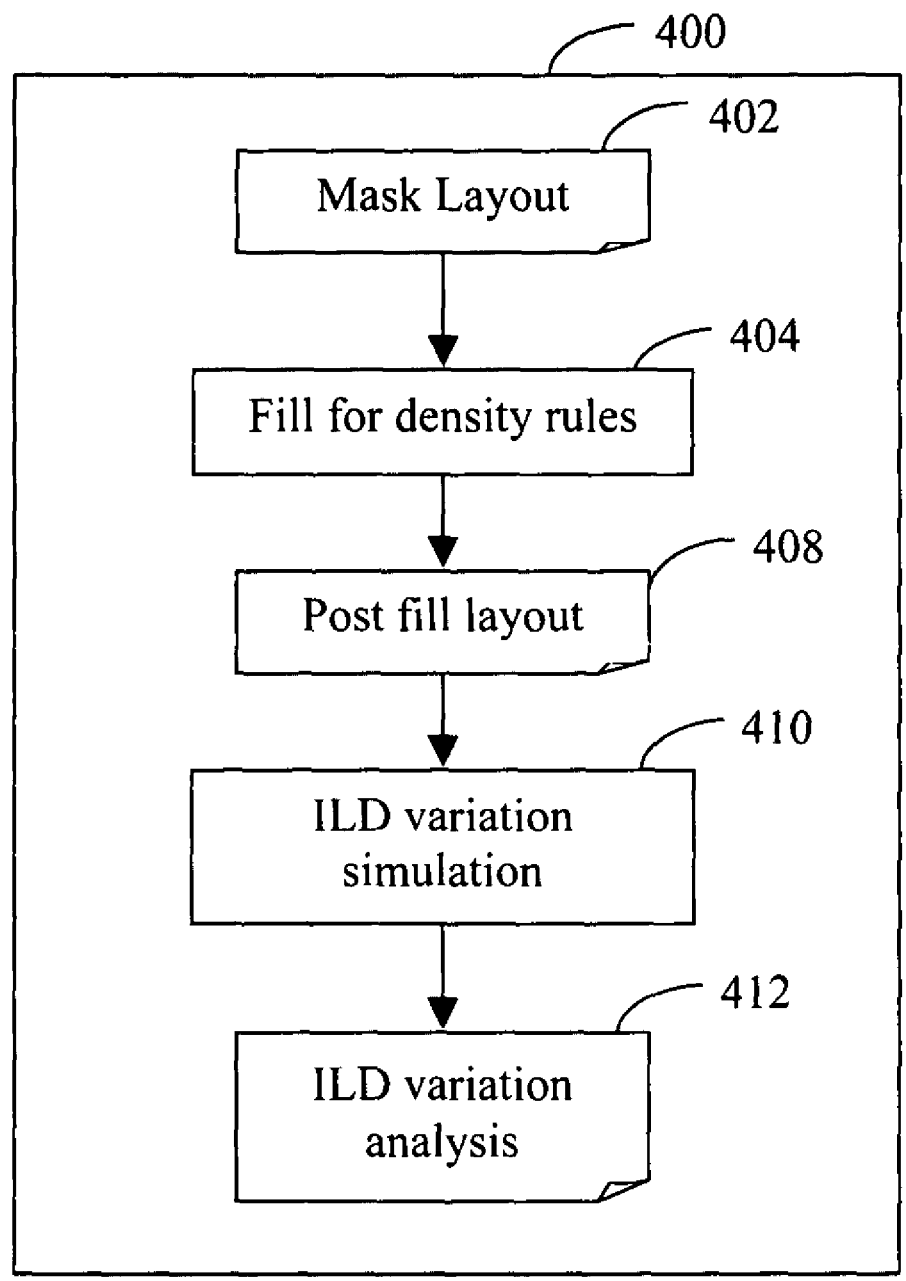
FIG. 4 illustrates a CMP process simulation based embodiment of the present invention.

FIG. 4 illustrates an embodiment of a CMP process simulation based LFPCA process 400 for the present invention. At 404, the process inserts dummy fill geometries on mask layout 402 to produce the post fill layout 408 that has the required pattern density range of values. The ILD variation analysis 410 accepts the post fill layout 408 and produces data used in the ILD variation analysis step 412.

Figure 5:
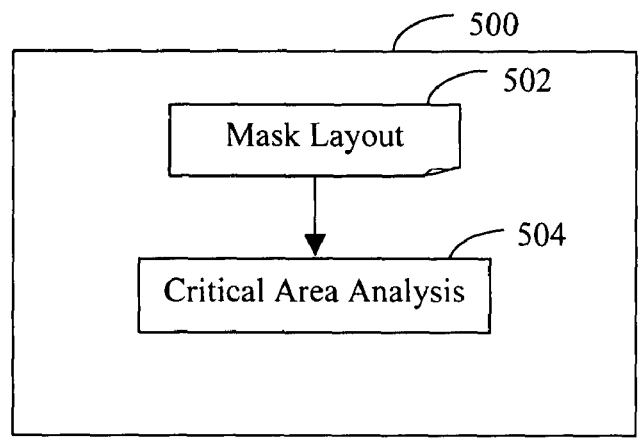
FIG. 5 illustrates a particle defect process simulation based embodiment of the present invention.

FIG. 5 illustrates an embodiment of a defect density based simulation based LFPCA process 500 for the present invention. At 504, the process performs a critical area analysis of the mask layout 502.

Figure 6:
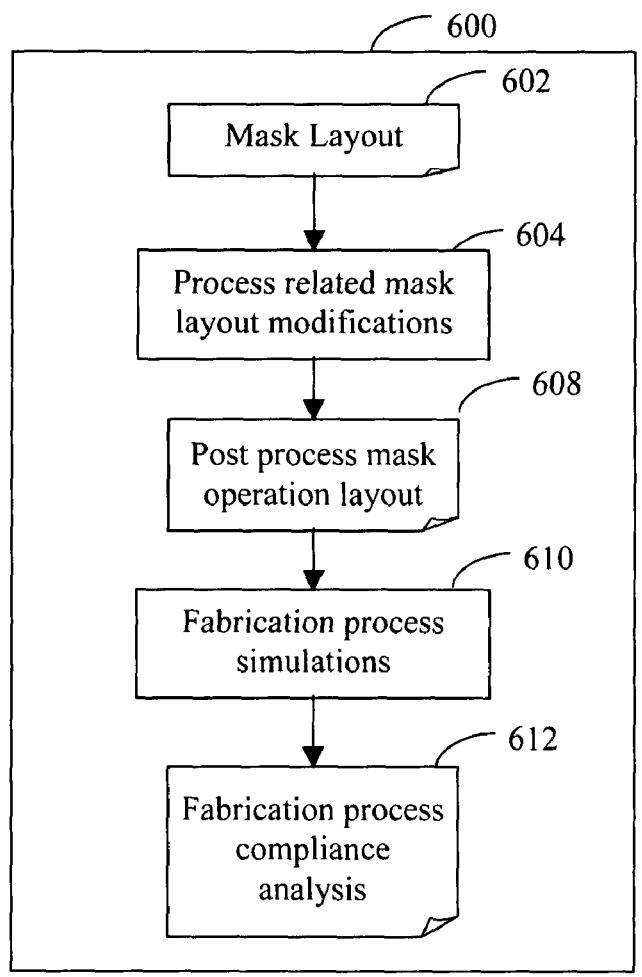
FIG. 6 illustrates a generalized LFPCA flow for some embodiment of the present invention.

FIG. 6 illustrates an embodiment of a generalized fabrication process simulation LFPCA process 600 for the present invention. At 604, the process takes as input the mask layout 602 to perform all the operations such as, but not limited to, construction of OPC features, geometry phase assignments for PSM, insertion of sub-resolution assist features ("SRAF") and insertion of dummy fill geometries for pattern density requirements and produces the post process mask layout 608. At 610, the process run various fabrication process simulations such as, but not limited to, lithography simulations ("litho-simulation"), litho-simulation followed by etch models for the actual semiconductor materials such as metal and poly, ILD variation analysis, and critical area analysis. The results of the various process simulations are analyzed at step 612 for any layout fabrication process compliance issues.

Layout Optimization Problem Formulation

The layout optimization procedure requires a representation for a mask layout data, a collection of constraints to be applied to the mask layout data, and an objective cost function to be optimized. The constraints include such items as, but are not limited to, design rule requirements, circuit requirements, connectivity and preservation of hierarchical design integrity. The mask layout data can either be flat or hierarchical.

Mask Layout Data Representation

Figure 7:
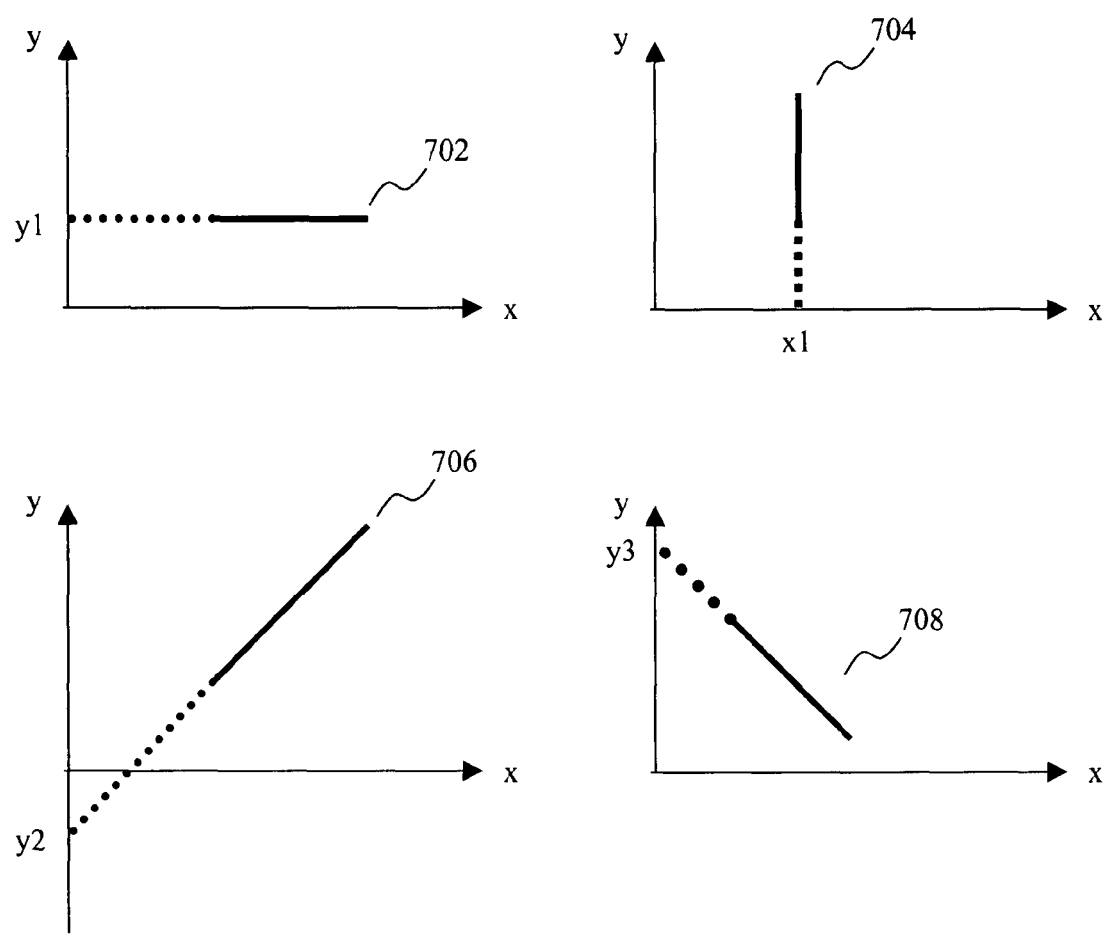
FIG. 7 illustrates an exemplary implementation of representing the location of an edge with variables in a flat design layout.

A layout optimization will adjust edges of the initial mask layout data to produce an optimized mask layout data. Consequently, a representation of mask layout data edges is a required component of a layout optimization system. FIG. 7 illustrates an exemplary implementation of representing the location of an edge with variables in a flat design layout. It is recognized that in the integrated circuit layout, the angles of all edges are multiples of 45 degrees. Each edge is represented by an angle, and a position variable. In cases when the edge is horizontal as edge 702, the angle is 0 or 180 degrees depending on the selection of the starting end point, the position variable is the intersection of the edge or its extension and Y-axis; in cases when the edge is vertical as edge 704, the angle is 90 or 270 degrees depending on the selection of the starting end point, the position variable is the intersection of the edge or its extension and X-axis; in cases when the angle is 45 or 225 degrees as edge 706 depending on the selection of the starting end point, the position variable is the intersection of the edge or its extension and Y-axis; in cases when the angle is 135 or 315 degrees as edge 708 depending on the selection of the starting end point, the position variable is the intersection of the edge or its extension and Y-axis. A corner in a mask layout is recognized as an artificial product of the two edges that intersects at the corner. It is represented by the variables defining the two edges. The formulation depends on the orientation of the two edges. A shape in a mask layout database is represented by the location of the vertices defining the shapes. There are, of course, numerous methods of representing layout geometries as long as they are canonical.

Figure 8:
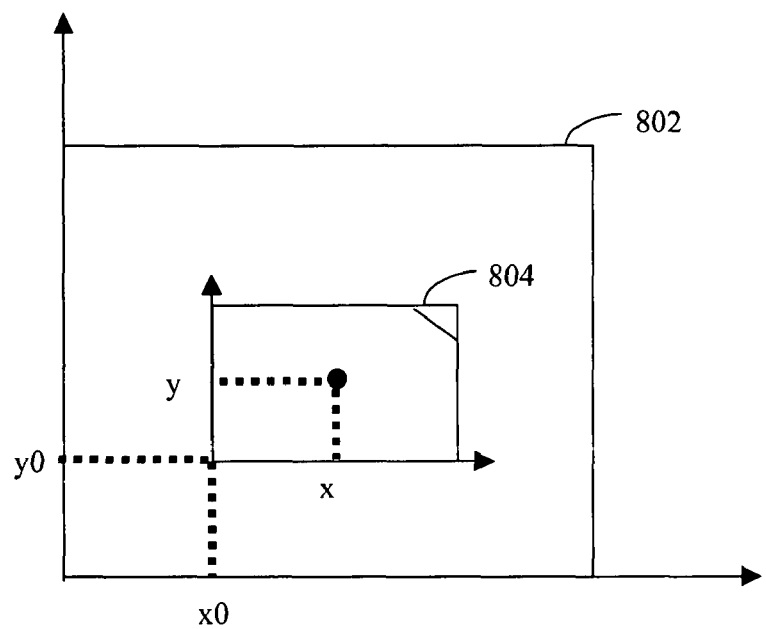
FIGS. 8-9 illustrates an exemplary implementation of a transform at one level of hierarchical design.
Figure 9:
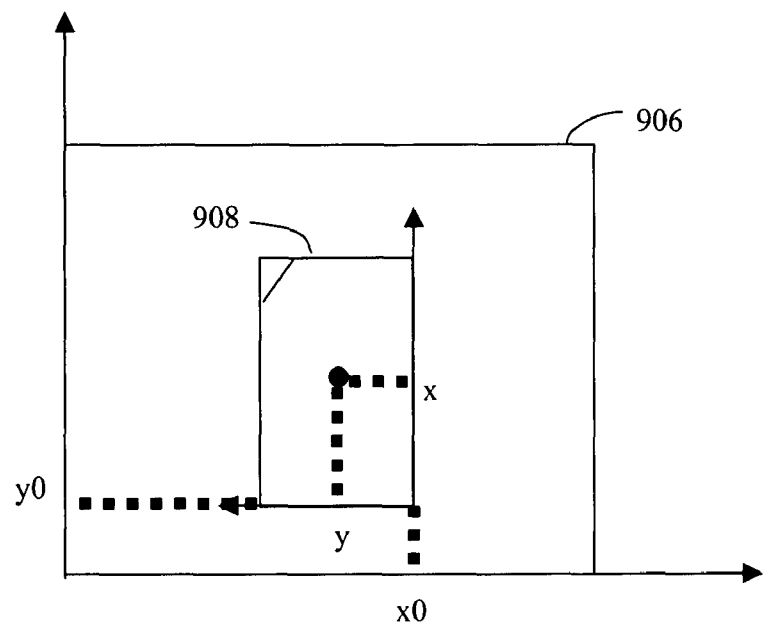

In a hierarchical design, each leaf design, which has no design descendants, has a chain of design ancestors. Each link of the ancestry carries a transform, which reflects how child design at that level is positioned in parent design. Representation of layout geometries at each design, is then transformed recursively upwards till it gets to top design level. FIG. 8-9 illustrates an exemplary implementation of a transform at one level of hierarchical design.

In FIG. 8, a child design instance 804 is positioned inside its parent design 802. The transform is an offset (x0, y0) with no rotation. A variable x representing a geometrical entity is then transformed to:

x+x0 in the framework of parent design.

A variable y representing a geometrical entity is then transformed to:

y+y0 in the framework of parent design.

In FIG. 9, a child design instance 908 is positioned inside its parent design 906. The transform is an offset (x0,y0) with a clockwise rotation of 90 degrees. A variable x representing a geometrical entity is then transformed to:

x+y0 in the framework of parent design.

A variable y representing a geometrical entity is then transformed to:

−y+x0 in the framework of parent design.

There are, of course, numerous methods of representing layout geometries in hierarchical design as long as they are canonical.

In a flat layout, an edge of a geometrical entity is normally represented by one position variable for the actual edge itself in some embodiments of the present invention. In a hierarchical layout, an edge of a geometrical entity is can be represented by a combination of position variables, as in an example shown in FIGS. 8-9.

An important implication for hierarchical design layout is that a layout optimization has the possibility of resolving LFPCA issues just by adjusting instance positions.

Cost Function Formulation

The present invention requires an LFPCA system produce a value for undesirability of an LFPCA issue. In one embodiment, a lithography simulation based LFPCA could quantify the quality "lithography friendliness" ("LLF") as the weighted sum of, among others, a function of square of edge placement error ("EPE") of relevant edges a function of mask enhancement error factor ("MEEF") of relevant edges a function of normalized image log slope ("NILS") of the relevant edges.

a function of depth of focus ("DOF") of the relevant edges.

$$LLF_{litho} = -C_{EPE} \sum_i func_{EPE}((EPE_i)^2) - C_{NILS} \sum_i func_{NILS}(NILS_i) - \\ C_{MEEF} \sum_i func_{MEEF}(MEEF_i) - C_{DOF} \sum_i func_{DOF}(DOF_i)$$

In another embodiment, a CMP process simulation based LFPCA system could quantify the ILD variations in a similar fashion as a function of the fabricated ILD thickness from the target ILD thickness.

$$VAR_{CMP} = \Sigma func_{ILD}(ILD_{simulated}, ILD_{spec})$$

In yet another embodiment, a critical area analysis based LFPCA system is perhaps the simplest since it only has to integrate critical area with the defect density distribution to get the expected defect limited yield number.

$$Yield_{defect} = \int criticalArea(r_d) pdf(r_d) dr_d$$

where criticalArea($r_d$)—layout regions sensitivity to defect of size $r_d$ pdf($r_d$)—defect size probability density function Some embodiments of the present invention use a generalized LFPCA undesirability function with various components for specific fabrication process LFPCA issues for various mask layout data configurations. Since the mask layout data can be represented by a vector $\hat{v}=(v_1, v_2, \ldots, v_n)$ for edges and instances as illustrated in FIGS. 7-9, an LFPCA undesirability function ("LUF") is a function of the mask layout.

$$LUF(\hat{v}) = k_1 \cdot LLF_{litho}(\hat{v}) + k_2 \cdot VAR_{CMP}(\hat{v}) + k_3 \cdot Yield_{defect}(\hat{v}) + \ldots$$

Some embodiments of the present invention use LUF as one of the components of the objective cost function for the layout optimization step. In general, the LFPCA procedure is a very complex system involving modeling one or more IC fabrication process steps followed by similarly complex analysis. Some embodiments of the present invention utilize an approximation of an LUF function using response surface modeling ("RSM") that those versed in the arts will recognized.

When all geometries are represented by polynomials (usually linear combinations) of position variables $v_i$ illustrated in FIGS. 7-9 exemplarily, LUF may be viewed as an expansion on these variables:

$$LUF = \\ LUF|_{v_i=v_i(0)\forall i} + \sum_i \frac{\partial LUF}{\partial v_i}(v_i - v_i(0)) + \sum_i \frac{\partial^2 LUF}{\partial v_i^2}(v_i - v_i(0))^2 + \ldots$$

In one embodiment of the present invention, if changes of all variables $v_i$ are limited to a reasonably narrow range, only the $1^{st}$ order gradients are taken into consideration for the evaluation of LUF to be reasonably accurate, i.e.

$$LUF = LUF|_{v_i=v_i(0)\forall i} + \sum_i \frac{\partial LUF}{\partial v_i}(v_i - v)$$

or $$\Delta LUF = \sum_i \frac{\partial LUF}{\partial v_i} \Delta v_i$$

Therefore, construction of LUF is equivalent to construction of the lower-order gradients of all position variables of LUF; it is equivalent to the $1^{st}$ order gradients of all position variables of LUF, given all $v_i$ change within a reasonably narrow range.

The advantage of using RSM techniques is that there is a plethora of literature on efficient methods of creating the models. This is especially true for specifying the running of the LFPCA analysis required to build LUF approximate models. Some embodiments utilize the two-level fractional factorial experimental design techniques popularized by Box, Hunter and Hunter. Other embodiments utilize other design of experiment techniques for more complex LUF approximations using such techniques, but not limited to, Latin hypercube and central composite sampling strategies.

Figure 10:
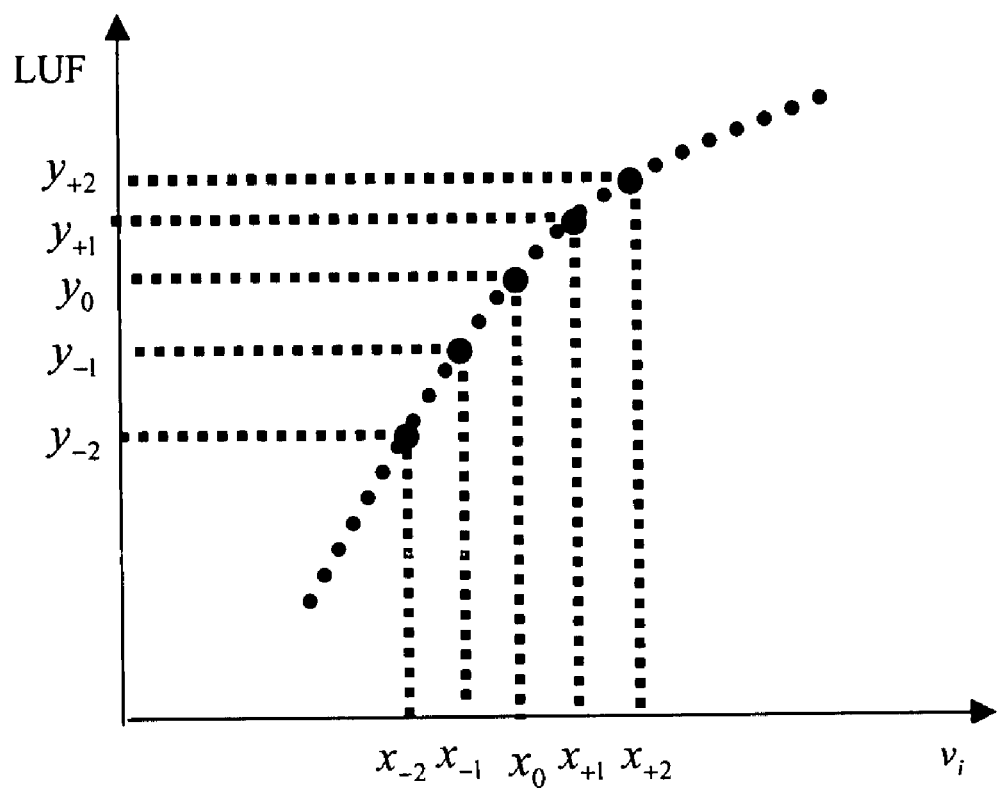
FIG. 10 illustrates how gradients of position variables of LUF are approximately obtained from some embodiment of the current invention.

FIG. 10 illustrates how gradients of position variables of LUF are approximately obtained at certain values of position variables. By measuring LUF using process simulations, the value of variable $v_i$ are sampled around its current value $x_0$. The value of LUF is measured at the sampled value of $v_i$. Those versed in the arts will recognize that the sampling strategy is well covered in the design of experiment literature.

Optimization Constraints

The construction of constraints of the optimization problem is done by enforcing: 1) design constraints including, but not limited to, design area, timing, connectivity for LVS (layout versus schematics) correctness; 2) satisfaction of a set of physical design rules between layout geometries; 3) bounds of position variables due to design requirement limits or step size requirements. These are important for a modified design layout to maintain integrity as far as DRC (design rule correct) and LVS (layout versus schematics) clean, meet reasonable requirements, and to ensure the validity of the constructed optimization problem.

After an optimization problem is solved, and an optimal or close to optimal solution is obtained, the design layout from which the optimization problem is constructed is modified by updating the locations of geometrical entities using the value of position values in the solution.

As the flow illustrated in FIG. 2, the loop terminates when the modified design pass LFPCA, or certain criteria are met. The end result is a design layout that is modified from an existing layout. The DRC correct and LVS clean modified layout maximizes manufacturing yield with minimal IC design quality and performance impacts.

Design Hierarchy Preservation

Figure 11:
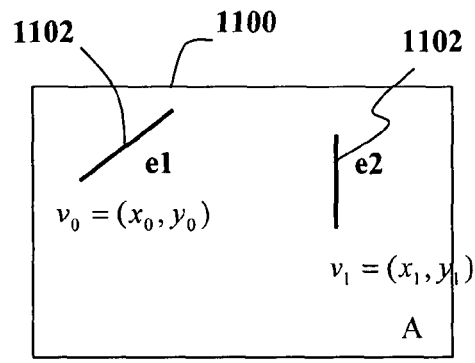
FIG. 11 illustrates a sub-design containing two edges.

Some embodiments of the present invention preserve the design layout hierarchy. In some cases, a sub-design representation is replicated as one or more instances within the layout hierarchy and presents an opportunity for some embodiments of the present invention to have layout optimization resolve LFPCA issues by adjusting instance locations rather than adjusting layout edges. In other embodiments, a single layout edge adjustment as part of the layout optimization step can resolve multiple LFPCA issues This is because an edge in a hierarchical design layout can be represented by two or more location variables as illustrated in FIGS. 8-9. One variable is associated with the edge within the sub-design while another variable describes the location of the instance of the sub-design. FIG. 11 illustrates a sub-design layout A (1100) containing edges e1 (1102) and e2 (1102) with location variables $v_0 = (x_0, y_0)$ and $V_1 = (x_1, y_1)$ respectively. The location variables $v_0$ and $v_1$ uniquely identifies edges within the layout 1100 and is adjusted by layout optimization process.

Figure 12:
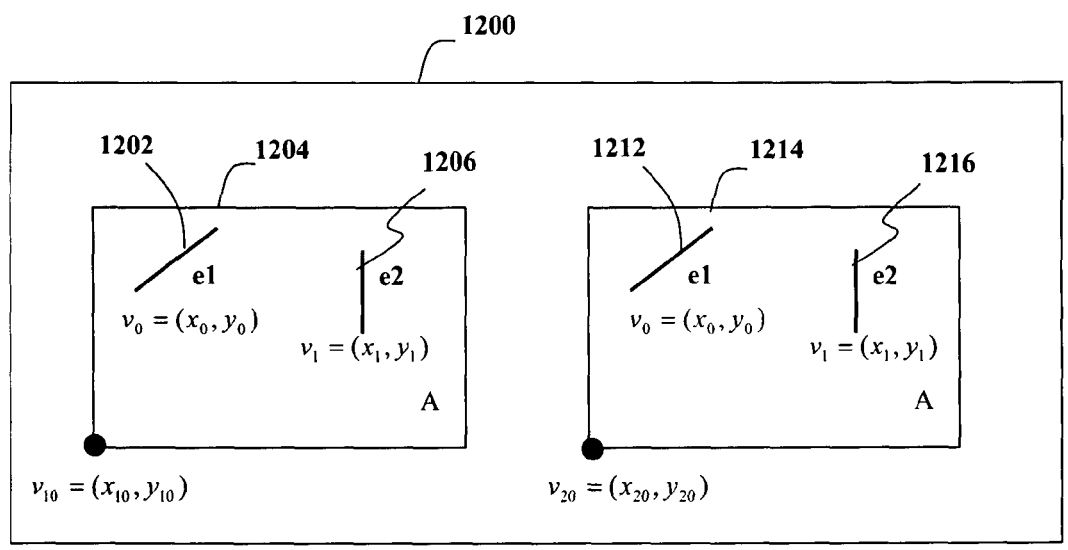
FIG. 12 illustrates two instances of the sub-design of FIG. 11.

FIG. 12 illustrates a layout 1200 that contains two instantiations of sub-design A at 1204 and 1214 respectively. The sub-design A instance 1204 has location variable $v_{10} = (x_{10}, y_{10})$ and sub-design A instance 1214 has location variable $v_{20} = (x_{20}, y_{20})$. The four edges 1202, 1206, 1212, and 1216 have position variables which are $v_0+v_{10}$, $v_1+v_{10}$, $v_0+v_{20}$, and $v_1+v_{20}$, respectively. Some embodiments of the present invention could have the layout optimization place a higher weight on adjusting position variables $v_{10}$ and $v_{20}$ of FIG. 12. A change in variable $v_{10}$, for example, could result in changes in edges 1202 and 1206.

Another embodiments of a layout optimization of the present invention could place a higher weight on adjusting variable associated only with edges so that sub-design changes are favored over adjustment of instance position variables. For example, a layout optimization embodiment of the present invention adjusting FIG. 12's $v_0$ variable would change edges 1202 and 1212.

These examples illustrate flexibility for layout optimization embodiment of the present invention in resolving LFPCA issues. This flexibility is a consequence of the present invention's approach to modeling the mask data layout as well as retaining the layout hierarchy.

Although the description above contains many specificities, these should be not be construed as limiting the scope of the invention but merely providing illustrations of some of the presently preferred embodiments of this invention.

Thus the scope of the invention should be determined by the appended claims and their equivalents, rather than by the examples given.

We claim:

1. A method, executed by at least one processor of a computer, for improving the manufacturing yield of integrated circuit comprising the steps:
   receiving a plurality of integrated circuit layout elements;
   constructing and allocating a plurality of position variables to a plurality of layout elements, wherein position variables represent locations of edges or points of the plurality of layout elements;
   constructing a constraint system using the positional variables, wherein the constraints represent relationships among edges or points of the plurality of layout elements;
   constructing a fabrication process compliance analysis undesirability function with inputs consisting of position variables;
   establishing an objective function composed of fabrication process compliance analysis undesirability function and weighted sum of plurality of position variables;
   solving an optimization problem of minimizing the objective function subject to the constraint system requirements; and
   generating new layout from the new position variable values.

2. The method of claim 1, wherein the integrated circuit layout is organized in a hierarchical manner consisting of master cells, plurality of instances of master cells, and plurality of instance arrays of master cells.

3. The method of claim 2 further comprising the step of:
   constructing and allocating a plurality of position variables to a plurality of master cell instances and to a plurality of instance arrays of master cells.

4. The method of claim 1, wherein the step of constructing the fabrication process compliance analysis undesirability function incorporates lithographic considerations.

5. The method of claim 1, wherein the step of constructing the fabrication process compliance analysis undesirability function incorporates critical area considerations.

6. The method of claim 1, wherein the step of constructing the fabrication process compliance analysis undesirability function incorporates chemical mechanical polishing related considerations.

7. The method of claim 1, wherein the step of constructing the fabrication process compliance analysis undesirability function incorporates weighted sum of lithographic, critical area and chemical mechanical polishing considerations.

8. A computer system of improving the manufacturing yield of integrated circuit comprising the steps:
   means for receiving a plurality of integrated circuit layout elements;

means for constructing and allocating a plurality of position variables to a plurality of layout elements, wherein position variables represent locations of edges or points of the plurality of layout elements;

means for constructing a constraint system using the positional variables, wherein the constraints represent relationships among edges or points of the plurality of layout elements;

means for constructing a fabrication process compliance analysis undesirability function with inputs consisting of position variables;

means for establishing an objective function composed of fabrication process compliance analysis undesirability function and weighted sum of plurality of position variables;

means for solving an optimization problem of minimizing the objective function subject to the constraint system requirements; and means for generating new layout from the new position variable values.

9. The computer system of claim 8, wherein the integrated circuit layout is organized in a hierarchical manner consisting of master cells, plurality of instances of master cells, and plurality of instance arrays of master cells.

10. The computer system of claim 9 further comprising the step of:

means for constructing and allocating a plurality of position variables to a plurality of master cell instances and to a plurality of instance arrays of master cells.

11. The computer system of claim 8, wherein the means for constructing the fabrication process compliance analysis undesirability function incorporates lithographic considerations.

12. The computer system of claim 8, wherein the means for constructing the fabrication process compliance analysis undesirability function incorporates critical area considerations.

13. The computer system of claim 8, wherein the means for constructing the fabrication process compliance analysis undesirability function incorporates chemical mechanical polishing related considerations.

14. The computer system of claim 8, wherein the means for constructing the fabrication process compliance analysis undesirability function incorporates weighted sum of lithographic, critical area and chemical mechanical polishing considerations.

* * * * *